(12) United States Patent
Jeon

(10) Patent No.: US 8,713,384 B2  
(45) Date of Patent: Apr. 29, 2014

(54) SEMICONDUCTOR APPARATUS

(75) Inventor: Byung Deuk Jeon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 286 days.

(21) Appl. No.: 13/219,649

(22) Filed: Aug. 27, 2011

(65) Prior Publication Data

US 2013/0002342 A1 Jan. 3, 2013

(30) Foreign Application Priority Data

Jun. 29, 2011 (KR) .......................... 10-2011-0063780

(51) Int. Cl.  
*G11C 29/00* (2006.01)

(52) U.S. Cl.  
USPC ........................................................ 714/718

(58) Field of Classification Search  
USPC .................. 714/718, 724, 726, 742; 702/118  
See application file for complete search history.

(56) References Cited

U.S. PATENT DOCUMENTS

| | | | | |
|---|---|---|---|---|
| 6,032,274 A | * | 2/2000 | Manning | 714/718 |
| 2009/0153176 A1 | * | 6/2009 | Inaba | 324/765 |
| 2011/0184688 A1 | * | 7/2011 | Uetake et al. | 702/120 |

FOREIGN PATENT DOCUMENTS

| KR | 1020080063452 A | 4/2008 |
|---|---|---|
| KR | 1020100133192 A | 12/2010 |
| KR | 1020110039205 A | 4/2011 |

* cited by examiner

*Primary Examiner* — Shelly A Chase  
(74) *Attorney, Agent, or Firm* — William Park & Associates Patent Ltd.

(57) ABSTRACT

A semiconductor apparatus includes first and second chips sharing first and second data channels. The first and second chips output normal data of the respective chips through the first and second data channels in a normal operation, and the first chip outputs test data of the first chip through the first data channel, and the second chip outputs test data of the second chip through the second data channel in a test operation.

12 Claims, 4 Drawing Sheets

SEMICONDUCTOR APPARATUS

CROSS-REFERENCES TO RELATED APPLICATION

The present application claims priority under 35 U.S.C. §119(a) to Korean Application Number 10-2011-0063780, filed on Jun. 29, 2011, in the Korean Intellectual Property Office, which is incorporated herein by reference in its entirety as set forth in full.

BACKGROUND

1. Technical Field

The present invention relates generally to a semiconductor apparatus, and more particularly, to a three-dimensional (3D) semiconductor apparatus.

2. Related Art

A semiconductor apparatus is verified through a variety of tests before being shipped as a product. In order to reduce the test time and increase test efficiency, a compression test is generally performed. The compression test is performed, for example, by compressing a plurality of data and detecting the level of the compressed data. According to the number of data to be compressed, the test time may vary.

Recently, in order to highly integrate a semiconductor apparatus, a 3D semiconductor apparatus is being developed. The 3D semiconductor apparatus is formed according to such a method that stacks and packages a plurality of chips within one package. According to a known art, the 3D semiconductor apparatus includes two or more chips which are stacked vertically, and thus may achieve a high integration in the same space.

A variety of methods may be applied to implement the 3D semiconductor apparatus. In one of the methods, a plurality of chips having the same configuration are stacked, and then coupled to each other through a wire such as a metal line so as to operate as one semiconductor apparatus.

Furthermore, a through via method, e.g., a through silicon via has been recently used. In the through via method, a plurality of stacked chips are electrically coupled using a through via formed through the chips. In the semiconductor apparatus using a through via, the respective chips are coupled through the through via formed in a vertical direction. Therefore, it is possible to more efficiently reduce a package area than the semiconductor apparatus in which the respective chips are coupled through edge interconnections using a wire.

Also, in the case of a 3D semiconductor apparatus which is packaged including a plurality of chips, the test time may be reduced by applying a technology for compression test circuits.

SUMMARY

A semiconductor apparatus capable of simultaneously testing a plurality of chips forming a single semiconductor apparatus is described herein.

In an embodiment of the present invention, a semiconductor apparatus includes first and second chips sharing first and second data channels. In a normal operation, the first and second chips output normal data of the respective chips through the first and second data channels, and in a test operation, the first chip outputs test data of the first chip through the first data channel, and the second chip outputs test data of the second chip through the second data channel.

In an embodiment of the present invention, a semiconductor apparatus includes: a data output control unit configured to generate first and second enable signals in response to a test control signal and a chip selection signal; a data selection unit configured to output first and second normal data to first and second data lines, respectively, or commonly output test data to the first and second data lines, in response to a test control signal; a first driver configured to output the data transmitted through the first data line to a first data channel in response to the first enable signal; and a second driver configured to output the data transmitted through the second data line to a second data channel in response to the second enable signal.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described below with reference to the accompanying drawings through exemplary embodiments.

Figure 1:
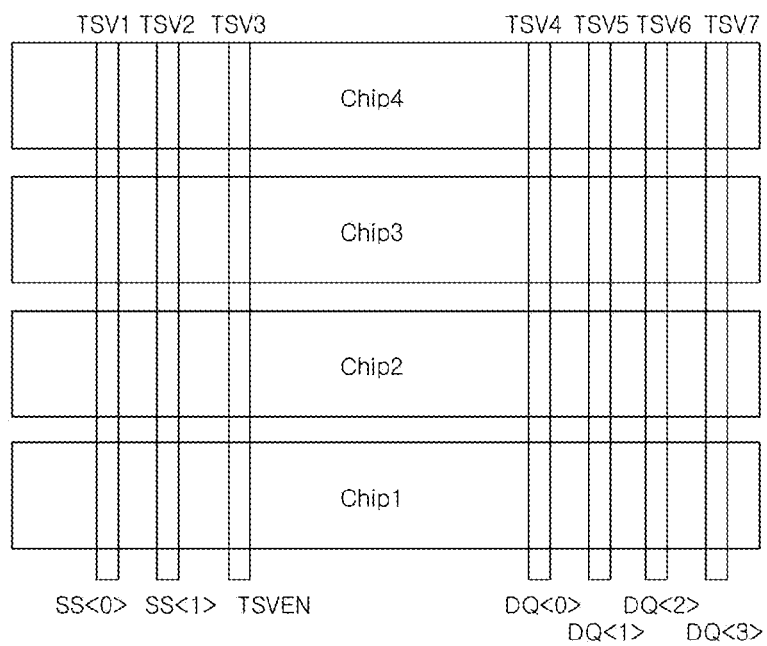
FIG. 1 schematically illustrates the configuration of a semiconductor apparatus according to an embodiment of the present invention.

FIG. 1 schematically illustrates the configuration of a semiconductor apparatus 1 according to an embodiment. FIG. 1 illustrates a 3D semiconductor apparatus including four chips which are stacked and packaged as a single semiconductor apparatus. In FIG. 1, the semiconductor apparatus 1 includes four chips, but the number of chips to be stacked is not limited specifically. The first, second, third and fourth chips Chip1, Chip2, Chip3 and Chip4 forming the semiconductor apparatus are electrically coupled to each other through a plurality of through silicon vias (TSVs). The respective TSVs are formed through the stacked chips Chip1, Chip2, Chip3 and Chip4. Since the TSVs are formed of a conductive material, the stacked chips may be coupled to each other through the TSVs.

In FIG. 1, a first TSV TSV1 serves to transmit a chip address signal SS<0> to the first, second, third and fourth chips Chip1, Chip2, Chip3 and Chip4, a second TSV TSV2 serves to transmit a chip address signal SS<1> to the first, second, third and fourth chips Chip1, Chip2, Chip3 and Chip4, a third TSV TSV3 serves to transmit a test mode signal TSVEN to the first, second, third and fourth chips Chip1, Chip2, Chip3 and Chip4, and fourth, fifth, sixth and seventh TSVs TSV4, TSV5, TSV6 and TSV7 serve as data channels DQ<0:3> of the first, second, third and fourth chips Chip1, Chip2, Chip3 and Chip4. FIG. 1 illustrates that the four data channels DQ<0:3> are formed. However, the number of data channels is not limited thereto, and the semiconductor apparatus may include a larger number of data channels and corresponding TSVs. The first, second, third and fourth chips Chip1, Chip2, Chip3 and Chip4 share the data channels DQ<0:3> by using the fourth, fifth, sixth and seventh TSVs TSV4, TSV5, TSV6 and TSV7 as the data channels DQ<0:3>. That is, data communication between the first, second, third and fourth chips Chip1, Chip2, Chip3 and Chip4 and an external controller or master chip (not illustrated) is performed through the fourth, fifth, sixth and seventh TSVs TSV4, TSV5, TSV6 and TSV7 shared by the first, second, third and fourth chips Chip1, Chip2, Chip3 and Chip4. In the following descriptions, the fourth TSV TSV4 corresponds to the first data channel DQ<0>, the fifth TSV TSV5 corresponds to the second data channel DQ<1>, the sixth TSV TSV6 corresponds to the third data channel DQ<2>, and the seventh TSV TSV7 substantially corresponds to the fourth data channel DQ<3>.

Figure 2:
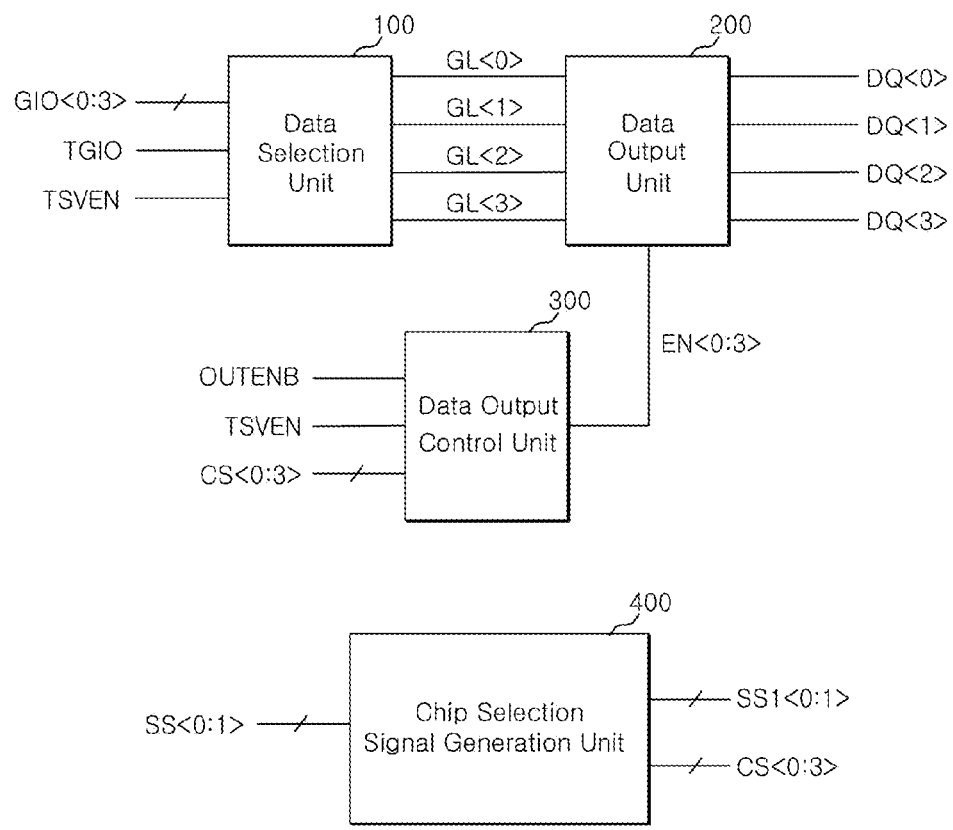
FIG. 2 schematically illustrates the exemplary configuration of a first chip among a plurality of chips illustrated in FIG. 1.

FIG. 2 schematically illustrates the configuration of the first chip among the plurality of chips illustrated in FIG. 1. In FIG. 2, the first chip Chip1 includes a data selection unit 100 and a data output unit 200. The data selection unit 100 may be electrically coupled to the data output unit 200 through first, second, third and fourth data lines GL<0:3>, and the data output unit 200 may electrically couple the first, second, third and fourth data lines GL<0:3> to the first, second, third and fourth data channels DQ<0:3>.

The data selection unit 100 is configured to output normal data GIO<0:3> of the first chip to the first, second, third and fourth data lines GL<0:3>, in a normal mode, and output test data TGIO of the first chip to the first, second, third and fourth data lines GL<0:3>, in a test mode. The normal mode may indicate an operation mode of the semiconductor apparatus 1, which does not correspond to the test mode. Whether the semiconductor apparatus 1 is to operate in the normal mode or the test mode may be decided on the basis of the test control signal TSVEN.

The test data TGIO of the first chip include compression test data. According to an example, in order to reduce a test time, a semiconductor apparatus stores data having the same level in a memory bank, and performs a data compression test which compresses the data outputted from the memory bank and then checks the level of the compression test data. The test data TGIO of the first chip may include compression test data generated during the data compression test or data obtained by compressing the normal data GIO<0:3> of the first chip.

The data output unit 200 is configured to output the data transmitted through the first, second, third and fourth data lines GL<0:3> to the first, second, third and fourth data channels DQ<0:3>, respectively, in the normal mode, and output one of the data transmitted through the first, second, third and fourth data lines GL<0:3> to the first data channel DQ<0>, in the test mode. In the normal mode, the data transmitted through the first, second, third and fourth data lines GL<0:3> are the normal data GIO<0:3> of the first chip. Therefore, the data output unit 200 outputs the normal data GIO<0:3> of the first chip through the first, second, third and fourth data channels DQ<0:3>, respectively. In the test mode, the data transmitted through the first, second, third and fourth data lines GL<0:3> are the test data TGIO of the first chip having the same level. Therefore, the data output unit 200 outputs one of the test data TGIO of the first chip, which are transmitted through the first, second, third and fourth data lines GL<0:3>, though the first data channel DQ<0>. According to an example, the data output unit 200 outputs the test data TGIO of the first chip, which is transmitted through the first data line GL<0>, to the first data channel DQ<0>.

Therefore, the first chip Chip1 may output the normal data GIO<0:3> of the first chip through the respective data channels DQ<0:3> in the normal mode, and output the test data TGIO of the first chip through the first channel DQ<0> in the test mode.

The second, third and fourth chips Chip2, Chip3 Chip4 illustrated in FIG. 1 may have the same configuration as that of the first chip Chip1. In this specification, as the first data selection unit 100 and the first data output unit 200 indicate a data selection unit and a data output unit arranged in the first chip Chip1, a second data selection unit and a second data output unit may indicate a data selection unit and a data output unit arranged in the second chip Chip2. Although not illustrated separately, the second chip Chip2 may include the second data selection unit and the second data output unit. The second chip Chip2 may output normal data of the second chip through the respective data channels DQ<0:3>, in the normal mode, and output test data of the second chip through the second data channel DQ<1>, in the test mode. The third and fourth chips Chip3 and Chip4 may also output test data through the third and fourth data channels DQ<2> and DQ<3>, respectively. Therefore, when the first, second, third and fourth chips Chip1, Chip2, Chip3 and Chip4 are stacked to form a single semiconductor apparatus, the test data of the first, second, third and fourth chips Chip1, Chip2, Chip3 and Chip4 may be simultaneously outputted through the first, second, third and fourth data channels DQ<0:3> shared by the first, second, third and fourth chips Chip1, Chip2, Chip3 and Chip4, in the test mode. As a result, the test may be simultaneously performed on the plurality of chips forming the single semiconductor apparatus, and thus the test time may decrease.

In FIG. 2, the first chip Chip1 further includes a data output control unit 300. The data output control unit 300 is configured to generate enable signals EN<0:3> to control the data output unit 200. The data output control unit 300 generates the enable signals EN<0:3> in response to a test control signal TSVEN and chip selection signals CS<0:3>. Furthermore, the data output control unit 300 may further use an output enable signal OUTENB indicating a read operation to generate the enable signals EN<0:3>, but the output enable signal OUTENB is not necessarily used. The chip selection signals CS<0:3> are signals to select at least one of the first, second, third and fourth chips Chip1, Chip2, Chip3 and Chip4, and may be generated by a chip selection signal generation unit 400.

The first chip Chip1 may further include the chip selection signal generation unit 400. The chip selection signal generation unit 400 is configured to receive chip address signals SS<0:1> and generate converted address signals SS1<0:1> and the chip selection signals CS<0:3>. The chip selection signal generation unit 400 transmits the converted address signals SS1<0:1> generated from the chip address signals SS<0:1> to the second chip Chip2, according to an example, through the first and second TSVs TSV1 and TSV2 illustrated in FIG. 1, and generates the chip selection signals CS<0:3> from the chip address signals SS<0:1>. Since the semiconductor apparatus 1 includes the first, second, third and fourth chips Chip1, Chip2, Chip3 and Chip4, each of the chip selection signals CS<0:3> is used to select one of the first, second, third and fourth chips Chip1, Chip2, Chip3 and Chip4, respectively. The chip selection signal generation unit 400 decodes the chip address signals SS<0:1> and generates the chip selection signals CS<0:3>. The first chip selection signal CS<0> is a signal to select the first chip Chip1, and the second, third and fourth chip selection signals CS<1:3> are signals to select the second, third and fourth chips Chip2, Chip3 and Chip4, respectively.

Figure 3:
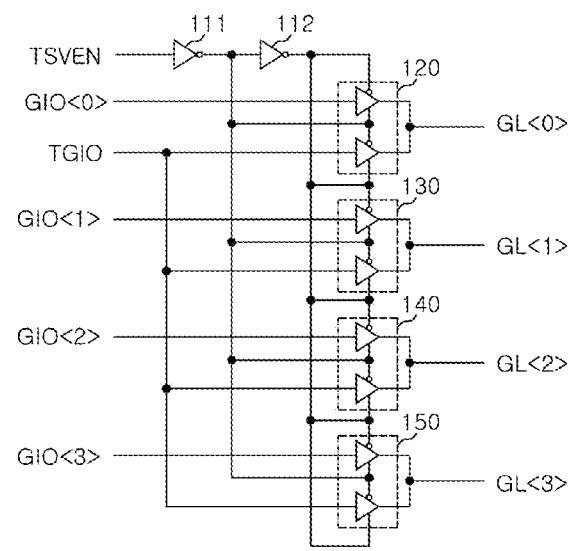
FIG. 3 illustrates the exemplary configuration of a data selection unit of FIG. 2.

FIG. 3 illustrates the configuration of the data selection unit of FIG. 2. The data selection unit 100 includes first and second inverters 111 and 112 and first, second, third and fourth multiplexers 120, 130, 140 and 150. The first inverter 111 is configured to invert the test control signal TSVEN. The second inverter 112 is configured to invert an output of the first inverter 111. The first multiplexer 120 is configured to output one of the normal data GIO<0> and the test data TGIO of the first chip to the first data line GL<0> in response to outputs of the first and second inverters 111 and 112. The first multiplexer 120 outputs the normal data GIO<0> of the first chip to the first data line GL<0> when the test control signal TSVEN is disabled, and outputs the test data TGIO of the first chip to the first data line GL<0> when the test control signal TSVEN is enabled.

The second multiplexer 130 is configured to output one of the normal data GIO<1> and the test data TGIO of the first chip to the second data line GL<1> in response to the outputs of the first and second inverters 11 and 112. Similarly, the third and fourth multiplexers 140 and 150 perform the same operation. Therefore, the data output unit 200 may output the normal data GIO<0:3> of the first chip to the first, second, third and fourth data lines GL<0:3>, respectively, in the normal mode, and output the test data TGIO of the first chip to the first to fourth data lines GL<0:3> in the test mode.

Figure 4:
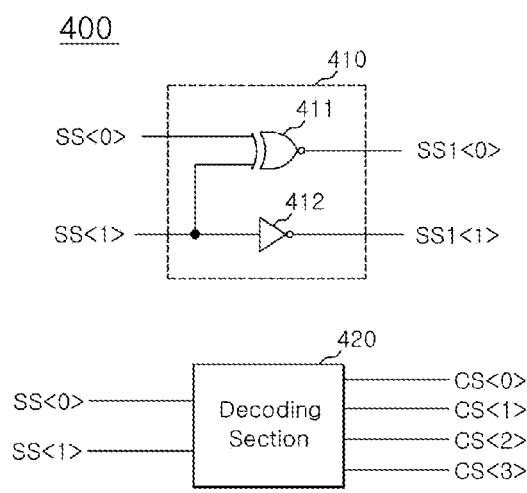
FIG. 4 illustrates the exemplary configuration and operation of a chip selection signal generation unit of FIG. 2.

FIG. 4 illustrates the configuration of the chip selection signal generation unit of FIG. 2. In FIG. 4, the chip selection signal generation unit 400 includes a converted address generation section 410 and a decoding section 420. The converted address generation section 410 is configured to receive the chip address signals SS<0:1> and generate the converted address signals SS1<0:1>. The converted address generation section 410 includes an XOR gate 411 and an inverter 412. The XOR gate 411 is configured to receive the first and second chip address signals SS<0:1> and generate the first converted address signal SS1<0>. The first inverter 412 is configured to invert the second chip address signal SS<1> and generate the second converted address signal SS1<1>. The converted address signals SS1<0:1> are transmitted through the first and second TSVs TSV1 and TSV2 and then inputted to a converted address generation section of the second chip Chip2. Also, according to an example, the converted address signals SS1<0:1> of the first chip Chip1 may become chip address signals SS<0:1> of the second chip Chip2. Further, the converted address generation section of the second chip Chip2 may have the same configuration as that of the converted address generation section 410 of the first chip Chip1, and generates another converted address signal. Converted address generation sections included in the third and fourth chips Chip3 and Chip4 may have the same configuration. According to the above-described configuration, the first chip Chip1 receives first and second chip address signals SS<0:1> of low levels, as shown in a table of FIG. 4. The second chip Chip2 receives a first chip address signal of a low level and a second chip address signal of a high level, that is, the converted address signal SS1<0:1> generated by the converted address generation section 410. The third chip Chip3 receives a first chip address signal of a high level and a second chip address signal of a low level, and the fourth chip Chip4 receives first and second chip address signals of high levels. Therefore, since each of the chip selection signal generation units 400 of the first, second, third and fourth chips Chip1, Chip2, Chip3 Chip4 receives a different combination of the chip address signals, the chip selection signal generation units 400 may generate the chip selection signals CS<0:3> to select one of the first, second, third and fourth chips Chip1, Chip2, Chip3 Chip4.

Figure 5:
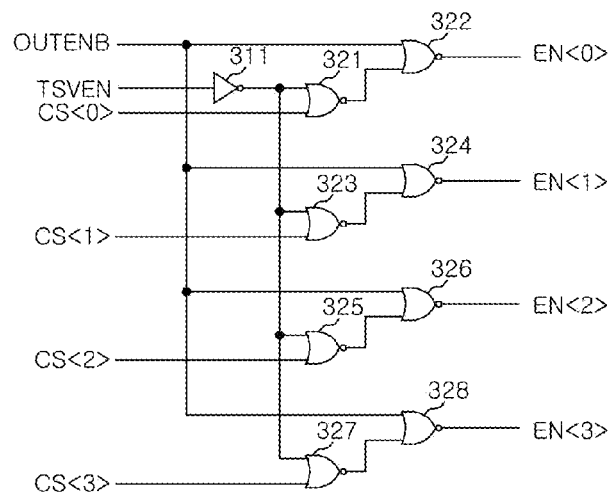
FIG. 5 illustrates the exemplary configuration of a data output control unit of FIG. 2.

FIG. 5 illustrates the configuration of the data output control unit of FIG. 2. In FIG. 5, the enable signal EN<0:3> includes the first, second, third and fourth enable signals EN<0:3> of which the number corresponds to the number of drivers of the data output unit 200 which will be described below. The data output control unit 300 includes a first inverter 311 and first, second, . . . , and eighth NOR gates 321, 322, . . . , and 328. The first inverter 311 is configured to invert the test control signal TSVEN. The first NOR gate 321 is configured to receive an output of the first inverter 311 and the first chip selection signal CS<0>. The second NOR gate 322 is configured to receive the output enable signal OUTENB and an output of the first NOR gate 321, and generate the first enable signal EN<0>. The third NOR gate 323 is configured to receive the output of the first inverter 311 and the second chip selection signal CS<1>. The fourth NOR gate 324 is configured to receive the output enable signal OUTENB and an output of the third NOR gate 323, and generate the second enable signal EN<1>. The fifth NOR gate 325 is configured to receive the output of the first inverter 311 and the third chip selection signal CS<2>. The sixth NOR gate 326 is configured to receive the output enable signal OUTENB and an output of the fifth NOR gate 325, and generate the third enable signal EN<2>. The seventh NOR gate 327 is configured to receive the output of the first inverter 311 and the fourth chip selection signal CS<3>. The eighth NOR gate 328 is configured to receive the output enable signal OUTENB and an output of the seventh NOR gate 327, and generate the fourth enable signal EN<3>. Therefore, the data output control unit 300 may enable all the enable signals EN<0:3> when the output enable signal OUTENB is enabled and the test control signal TSVEN is disabled. Also, the data output control unit 300 may selectively enable the first, second, third and fourth enable signals EN<0:3> in response to the chip selection signals CS<0:3>, when the output enable signal OUTENB and the test control signal TSVEN are enabled. The chip selection signal generation unit 300 of the first chip Chip1 enables the first chip selection signal CS<0>, and disables the second, third and fourth chip selection signals CS<1:3>. Therefore, the data output control unit 300 may enable the first enable signal EN and disable the second, third and fourth enable signals EN<1:3>, in response to the chip selection signals CS<0:3>.

The data output control units of the second, third and fourth chips may enable the second, third and fourth enable signal EN<1:3> in response to chip selection signals generated by the respective chip selection signal generation units.

Figure 6:
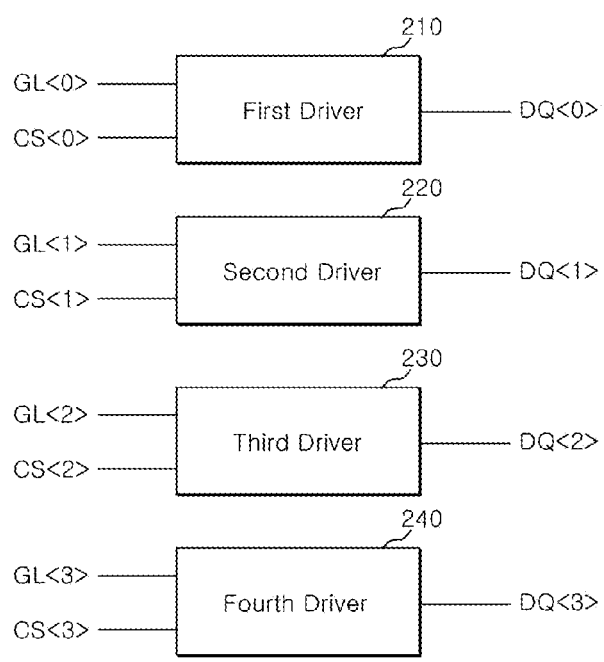
FIG. 6 illustrates the exemplary configuration of a data output unit of FIG. 2.

FIG. 6 illustrates the configuration of the data output unit of FIG. 2. In FIG. 6, the data output unit 200 includes first, second, third and fourth drivers 210, 220, 230 and 240. The first, second, third and fourth drivers 210, 220, 230 and 240 are configured to electrically couple the first, second, third and fourth data lines GL<0:3> to the first, second, third and fourth data channels DQ<0:3>, respectively. The first driver 210 is configured to output data transmitted through the first data line GL<0> to the first data channel DQ<0> in response to the first enable signal EN<0>. The second driver 220 is configured to output data transmitted through the second data line GL<1> to the second data channel DQ<1> in response to the second enable signal EN<1>. Similarly, the third and fourth drivers 230 and 240 output data transmitted through the third and fourth data lines GL<3:4> to the third and fourth data channels DQ<2:3>, respectively, in response to the third and fourth enable signals EN<2:3>.

In the normal mode, since all the enable signals EN<0:3> are enabled, all the drivers 210, 220, 230 and 240 are activated, and the normal data GIO<0:3> of the first chip transmitted through the first, second, third and fourth data lines GL<0:3> may be outputted to the first, second, third and fourth data channels DQ<0:3>. In the test mode, since only the first enable signal EN<0> is enabled, only the first driver 210 is activated. Therefore, the test data TGIO of the first chip transmitted through the first data line GL<0> may be outputted through the first data channel DQ<0>.

As described above, the second, third and fourth chips Chip2, Chip3 and Chip4 may have the same configuration as the first chip Chip1. However, the first, second, third and fourth enable signals EN<0:3> received by the data output unit may vary depending on the chip selection signal CS<0:3>. Therefore, the second chip Chip2 outputs the test data of the second chip to the second data channel DQ<1> through the second driver of the data output unit of the second chip, in the test mode. The third chip Chip3 outputs the test data of the third chip to the third data channel DQ<2> through the third driver of the data output unit of the third chip, in the test mode. The fourth chip Chip4 outputs the test data of the fourth chip to the fourth data channel DQ<3> through the fourth driver of the data output unit of the fourth chip, in the test mode.

Therefore, the semiconductor apparatus 1 according to an embodiment of the present invention may simultaneously output the test data of the first, second, third and fourth chips Chip1, Chip2, Chip3 and Chip4 to the first, second, third and fourth data channels DQ<0:3>, respectively, in the test mode.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising first and second chips sharing first and second data channels,
   wherein the first and second chips output normal data of the respective chips through the first and second data channels in a normal operation, and
   the first chip outputs test data of the first chip through the first data channel, and the second chip outputs test data of the second chip through the second data channel in a test operation,
   wherein the first chip comprises a first data selection unit configured to output the normal data of the first chip to a plurality of first-chip data lines, respectively, in the normal operation, and output the test data of the first chip to the plurality of first-chip data lines in the test operation; and
   a first data output unit configured to output the normal data of the first chip, which are transmitted through the plurality of data lines, through the first and second data channels, respectively, in the normal operation, and output the test data of the first chip, which are transmitted through the plurality of data lines, through the first data channel.

2. The semiconductor apparatus of claim 1, wherein the test data of the first and second chips comprise data obtained by compressing the normal data of the first and second chips, respectively.

3. The semiconductor apparatus of claim 1, wherein the plurality of first-chip data lines comprise first and second data lines, and
   the first data output unit comprises:
   a first driver configured to output data transmitted through the first data line to the first data channel in response to a first enable signal; and
   a second driver configured to output data transmitted through the second data line to the second data channel in response to a second enable signal.

4. The semiconductor apparatus of claim 3, further comprising a data output control unit configured to generate the first and second enable signals in response to a test control signal and a chip selection signal which are enabled in the test mode, and
   the data output control unit enables the first and second enable signals regardless of the chip selection signal, when the test control signal is disabled, and enables the first enable signal and disables the second enable signal in response to the chip selection signal, when the test control signal is enabled.

5. The semiconductor apparatus of claim 1, wherein the second chip comprises:
   a second data selection unit configured to output the normal data of the second chip to a plurality of second-chip data lines, respectively, in the normal operation, and output the test data of the second chip to the plurality of second-chip data lines in the test operation; and
   a second data output unit configured to output the normal data of the second chip, which are transmitted through the plurality of data lines, through the first and second data channels, respectively, in the normal operation, and output the test data of the second chip, which are transmitted through the plurality of data lines, through the second data channel in the test operation.

6. The semiconductor apparatus of claim 5, wherein the plurality of second-chip data lines comprise first and second data lines, and
   the second data output unit comprises:
   a first driver configured to output data transmitted through the first data line to the first data channel in response to a first enable signal; and
   a second driver configured to output data transmitted through the second data line to the second data channel in response to a second enable signal.

7. The semiconductor apparatus of claim 6, further comprising a data output control unit configured to generate the first and second enable signals in response to a test control signal and a chip selection signal which are enabled in the test mode, and
   the data output control unit enables the first and second enable signals regardless of the chip selection signal, when the test control signal is disabled, and enables the first enable signal and disables the second enable signal in response to the chip selection signal, when the test control signal is enabled.

8. A semiconductor apparatus comprising:
   a data output control unit configured to generate first and second enable signals in response to a test control signal and a chip selection signal;
   a data selection unit configured to output first and second normal data to first and second data lines, respectively, or output test data to the first and second data lines in common, in response to a test control signal;
   a first driver configured to output the data transmitted through the first data line to a first data channel in response to the first enable signal; and
   a second driver configured to output the data transmitted through the second data line to a second data channel in response to the second enable signal.

9. The semiconductor apparatus of claim 8, wherein the test data comprise data obtained by compressing the first and second normal data.

10. The semiconductor apparatus of claim 8, further comprising a chip selection signal generation unit configured to receive a chip address signal and generate the chip selection signal.

11. The semiconductor apparatus of claim 8, wherein the data output control unit activates the first and second enable signals regardless of the chip selection signal, when the test control signal is disabled, and selectively activates the first and second enable signals according to the chip selection signal, when the test control signal is enabled.

12. The semiconductor apparatus of claim 8, wherein the data selection unit comprises:
 a first multiplexer configured to output one of the first normal data and the test data to the first data line in response to the test control signal; and
 a second multiplexer configured to output one of the second normal data and the test data to the second data line in response to the test control signal.

* * * * *